United States Patent [19]

Tsukii

[11] Patent Number: 5,027,084
[45] Date of Patent: Jun. 25, 1991

[54] TRANSCEIVER MODULES FOR PHASED ARRAY ANTENNA

[75] Inventor: Toshikazu Tsukii, Santa Barbara, Calif.

[73] Assignee: Raytheon Company, Lexington, Mass.

[21] Appl. No.: 444,191

[22] Filed: Nov. 30, 1989

[51] Int. Cl.$^5$ .............................................. H03F 3/68
[52] U.S. Cl. ..................................... 330/295; 330/107; 330/286
[58] Field of Search ...................... 330/54, 55, 84, 107, 330/124 R, 277, 286, 295, 302

[56] References Cited

U.S. PATENT DOCUMENTS 4,788,509 11/1988 Bahl et al. ............................. 330/54
4,845,440 7/1989 Aitchison ......................... 330/286 X

OTHER PUBLICATIONS

Design and Performance of a 2-18 GHz Monolithic Matrix Amplifier, A. P. Chang, K. B. Niclas, B. D. Cantos, and W. A. Strifler, IEEE 1989 Microwave and Millimeter-Wave Monolithic Circuits Symposium, pp. 139-141.
The Matrix Amplifier: A High-Gain Module for Multi-octave Frequency Bands, Karl B. Niclas and Ramon R. Pereira, IEEE Transactions on Microwave Theory and Techniques, vol. MTT-35, No. 3, Mar. 1987, pp. 296-306.
Designing a Family of Broadband GaAs MMIC Switches, brochure Compact Software, Inc., pp. 7-8.

*Primary Examiner*—Steven Mottola
*Attorney, Agent, or Firm*—Denis G. Maloney; Richard M. Sharkansky

[57] ABSTRACT

A transceiver module includes a bi-directional amplifier having a pair of symmetric signal paths for amplification of both transmit and receive signals is described. The amplifier is a bi-directional amplifier and includes a pair of symmetric signal paths. The amplifier is disposed between a pair of r.f. switches to provide a pair of signal paths between two terminals of the module. A phase shifter is coupled between on of the terminals of the module and one of the r.f. switches, wherein the second terminal of the module is coupled directly to the other one of the pair of switches.

12 Claims, 7 Drawing Sheets

TRANSCEIVER MODULES FOR PHASED ARRAY ANTENNA

BACKGROUND OF THE INVENTION

This invention relates generally to antenna systems and more particularly to phased array antenna systems.

As is known in the art, an array antenna includes a plurality of individually radiating elements. Each of such elements are typically independently controlled to radiate a electromagnetic signal having a selected relative phase relationship to the other ones of the microwave signals. The relative phase of each of the microwave signals, therefore, is controlled to obtain a desired radiation pattern. The pattern obtained is the result of the combined action of all the individual transceiver and radiating elements. Several techniques exist for providing the desired control of the individual radiating elements to achieve the desired radiation pattern. In general, a phase shifter is disposed to provide the selected phase shift characteristic. Generally, in more sophisticated phased array radar systems, the phase shifter is included as part of a transceiver circuit or module. A transceiver circuit or module has the capability of providing a transmit and a receive path in which the phase of the module can be controlled.

Several techniques exist for providing so-called transceiver modules. In general, the transceiver module includes a low noise amplifier for the receive mode, a power amplifier for the transmit mode, and a pair of single pole double-throw switches. Branch ports of each of the switches are coupled to an input and an output of each one of the amplifiers. This arrangement is then coupled to a reciprocal phase shifter. Thus such a transceiver includes a pair of amplifiers, each disposed in one of the pair of signal paths which are both coupled to a reciprocal phase shifter. Although useful for many applications, this transceiver architecture is not desirable for jamming monopulse radars because of the large differences in insertion phase which exist between the distinct signal paths, particularly due to the separate transmit and receive amplifiers.

An alternative arrangement is to provide a common signal path through which both transmit and receive signals pass through a phase shifter and amplifier. Although this architecture provides a common signal path for both transmit and receive signals obviating the problem of insertion phase, this advantage is achieved at the cost of two additional transmit receive switches. One of these transmit receive switches is connected in series between the signal path and the antenna element. Accordingly, the output signal from the amplifier during transmit will always be attenuated by the presence of two series switches, thus causing a relatively poor efficiency for the transceiver module. In some applications this is tolerable but in other applications it is undesirable.

A further problem with each of these techniques is that it is most desirable to provide a transceiver module architecture on a single monolithic microwave integrated circuit. The general trend in microwave technology particularly as it relates to phased array elements is to form these circuits on a single integrated circuit using monolithic microwave integrated circuit techniques. Thus, any architecture which increases the number of components provides a concomitant reduction in the ability to successfully integrate the transmit/receive function as a single integrated circuit with acceptable yields and cost.

SUMMARY OF THE INVENTION

In accordance with the present invention, a circuit for coupling a pair of electromagnetic signals between a pair of terminals includes means for steering electromagnetic energy between said pair of terminals through a pair of signal paths, said signal paths being selected in accordance with a control signal fed to the steering means, and a bi-directional amplifier responsive to said electromagnetic energy and disposed in said signal paths, said bi-directional amplifier having a pair of input signal terminals and a pair of output signal terminals. One set of the input signal terminal and output signal terminal of the bi-directional amplifier are coupled in to the first path whereas the other set of input signal terminal and output signal terminal are coupled in to the second signal path. With this particular arrangement, the amplifier can provide a pair of substantially identical electrical signal paths and thus when disposed within the steering means provides a circuit which has identical insertion phase between the two different signal paths.

In accordance with a further aspect of the present invention, a transceiver for steering a pair of signals between a pair of terminals includes means for steering said pair of signals between a pair of signal paths, said signal paths being selected in accordance with a control signal fed to said steering means. The transceiver further includes a bi-directional amplifier having a pair of input signal ports and a pair of output signal ports, with a first one of the pair of input signal ports, and a first one of the pair of output signal ports providing a first set of terminals of the amplifier and being disposed to complete a first signal path of the steering means. A second one of the pair of input terminals and a second one of the pair of output terminals of the bi-directional amplifier are disposed to provide a second set of terminals of the amplifier and are disposed to complete the second signal path of said steering means. The transceiver further includes means for controlling the relative phase of signals fed to the transceiver. With this particular arrangement, a transceiver having a pair of signal paths through a single amplifier is provided. Such a transceiver element will have substantially identical relative insertion phase between signals in both the transmit and receive mode, and thus would be desirable, particularly for a phased array in a jammer to jam monopulse radars.

In accordance with a still further aspect of the present invention, a transceiver module includes a first steering means having a common port and a pair of branch ports, with the common port being coupled to a first terminal of the transceiver. The transceiver further includes a second steering means having a common port and a pair of branched ports with a common port being coupled to a second terminal of the transceiver. A bi-directional distributed amplifier is disposed to couple the pair of branched ports of the first steering means with the pair of branched ports of the second steering means. The bi-directional amplifier has a pair of input terminals, a first one of said input terminals being coupled to a first branch port of the first steering means and a second one of said pair of input terminals being coupled to a first branch port of the second steering means. The bi-directional amplifier further has a pair of output ports with a first one of said output ports being coupled to the second branch port of the first steering means and a second one of said pair of output ports of the amplifier being coupled to a second one of the branch ports of the second steering means. The transceiver further includes means disposed within a common path for providing a selected phase shift of the transceiver. With this particular arrangement, the bi-directional amplifier provides a pair of identical signal paths through the transceiver element. These signal paths thus will minimize relative insertion phase differences between the transmit and receive paths of the transceiver. Moreover, by providing a single bidirectional amplifier, one of the amplifiers of the conventional approach has been eliminated, without the need for providing extra transmit/receive switches.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENTS

Figure 1:
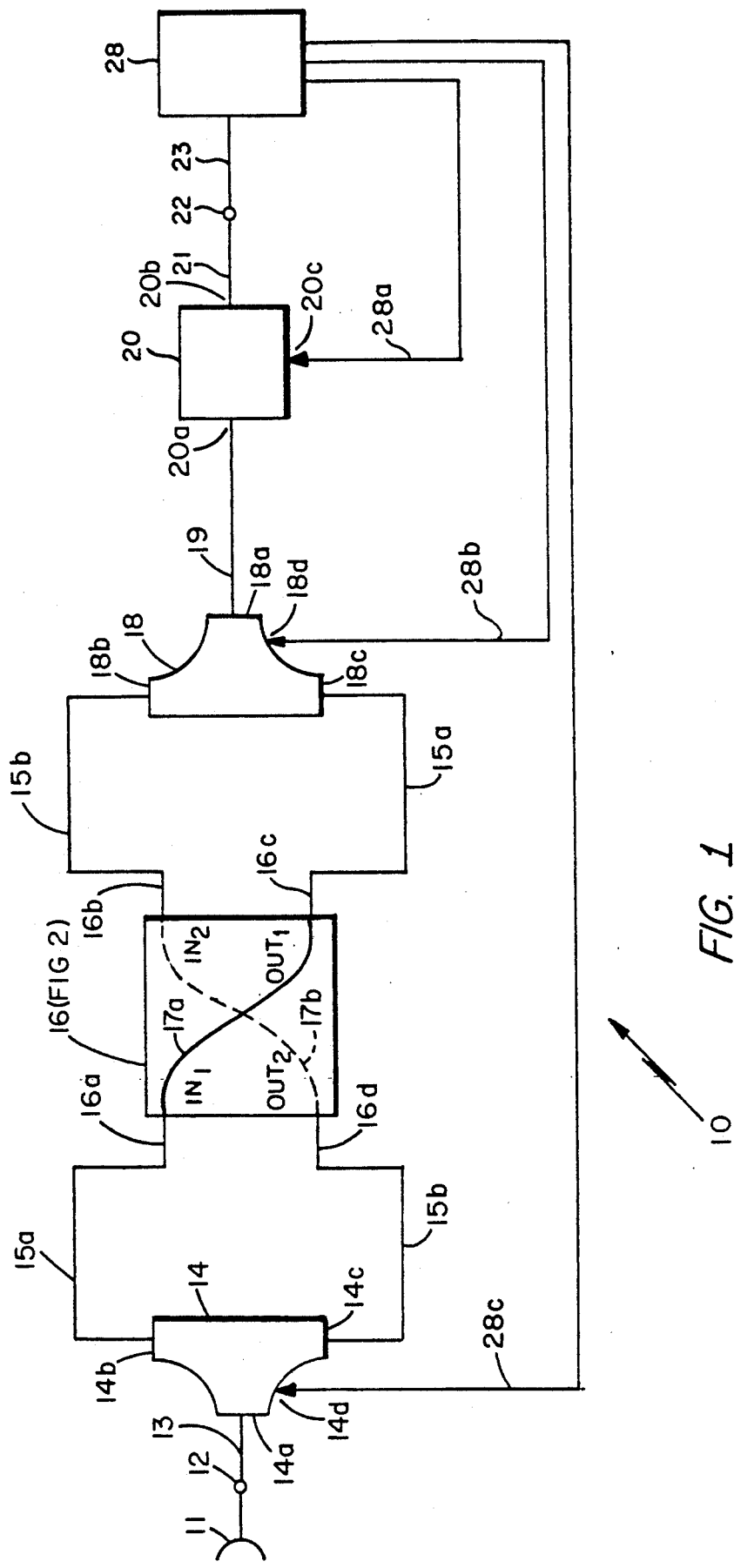
FIG. 1 is a schematic representation of a transceiver circuit for use in a phased array antenna in accordance with an aspect of the present invention.

Referring now to FIG. 1, a transceiver circuit 10 for use in a phased array antenna (not shown) includes a first r.f. switch 14 and a second r.f. switch 18 to steer an r.f. signal between a pair of terminals 12, 22 of the transceiver 10 through a pair of signal paths 15a, 15b as shown. R.F. switch 14 includes a common port 14a coupled to antenna element 11 via a transmission line 13 and a pair of branch ports 14b, 14c, as shown. Whereas, r.f. switch 18 includes a common port, 18a coupled to a phase shifter 20 via transmission line 19 and a pair of branch ports 18b, 18c, as shown. The common port 14a of switch 14 is coupled to a radiating element 11 at the first terminal 12 of the transceiver circuit 10. Each switch 14, 18 has a control port 14d, 18d, respectively which in response to a control signal fed thereto couples a selected one of the branch ports 14b, 14c of switch 14 and branch ports 18b, 18c of switch 18 to the respective common port 14a, 18a. Preferable to maintain symmetric impedances through the circuit, such switches 14, 18, and all switches described herein, are terminating switches which present a suitable characteristic impedance at the isolated terminal, to terminate lines fed thereto. The other of said branch ports is substantially electrically isolated from the common port.

The transceiver 10 is shown to further include a symmetrical bi-directional amplifier 16, as will be described in conjunction with FIG. 2. Suffice it here to say that symmetrical bi-directional amplifier 16 has a pair of input signal terminals 16a, 16b and a pair of output signal terminals 16c, 16d. Amplifier 16 has a first signal path 17a therethrough between input terminal 16a and output terminal 16c and a second substantially electrically identical signal path 17b, between terminal 16b and terminal 16d, as shown. Thus, input terminal 16a of symmetrical bi-directional amplifier 16 is coupled to branch port 14b of r.f. switch 14 whereas, the second output terminal 16d of symmetrical bi-directional amplifier 16 is coupled to branch port 14c of r.f. switch 14. The branch terminals 18b, 18c of r.f. switch 18 are coupled respectively to second input terminal 16b and first output terminal 16c of amplifier 16. The common terminal 18a of r.f. switch 18 is coupled via transmission line 19 to a first input/output port 20a of the phase shifter 20. A second input/output port 20b of phase shifter 20 is coupled to the second terminal 22 of transceiver 10. Phase shifter 20 further has a control port 20c which is responsive to a control signal to impart a selective differential phase shift to a signal propagating through the phase shifter 20. Phase shifter 20 is here a reciprocal phase shifter and may be a reciprocal electronic phase shifter or a ferrite phase shifter or an active phase shifter having reciprocating switches. Examples of phase shifters are described in U.S. Pat. No. 4,635,062 and U.S. patent application Ser. No. 364,414 filed on June 12, 1989 by John Wendler, now U.S. Pat. No. 4,961,062, both assigned to the assignee of the present invention. The output terminal 22 of transceiver 20 is coupled to a utilization system 28 (such as a jammer or radar) which may include a corporate feed network (not shown) for example to distribute signals to the array elements (now shown). Such an arrangement is also described in the above U.S. Pat. No. 4,635,062 and assigned to the assignee of the present invention.

Transceiver 10 operates in a first or transmit mode of operation by coupling a transmit signal between the utilization system 28 and the antenna element 12. Transceiver 10 also operates separately or simultaneously in a second or receive mode of operation, by coupling a signal from the radiating element 12 through the transceiver 10 to the utilization system 28.

In the transmit mode the transmit signal from radar system 28 is fed to the input/output port 20b of here an n-bit phase shifter 20 and in response to a control signal fed along line 28a, to control port 20c provides a selected differential phase shift to the transmit signal propagating therethrough. The differentially phase shifted signal emerges at port 20a and is fed to common port 18a of switch 18. In response to a second control signal fed on control line 28b, a signal path is provided between terminal 18a and terminal 18b of switching means 18 to thus couple the transmit, phase shifted signal to the second input terminal 16b of amplifier 16. The transmit, phase shifted signal is amplified by amplifier 16 and emerges from amplifier 16 at second output terminal 16d. The amplified and phase shifted signal is then fed to the second branch terminal 14c of the first switch 14 and in response to a third different control signal fed via line 28c to port 14d of switch 14, a signal path is created between port 14c and port 14a of switch 14 thus coupling said signal to radiating element 11.

Correspondingly, in a receive mode, a receive signal is fed from radiating element 11 and coupled to the common port 14a of steering means 14. In response to a complimentary state of the control signal fed on line 28c, a second, different signal path is provided between a common port 14a and first branch port 14b, thus feeding the received signal to the first input terminal 16a of amplifier 16. An amplified, receive signal appears at the first output terminal 16c of amplifier 16 and is fed to the second branch port 18c of switch 18. In response to a complimentary state of control signal fed on line 28b, a signal path is provided between terminal 18c and common terminal 18a. The signal is thus fed from terminal 18a to terminal 20a of the phase shifter 20. A second, relative differential phase shift is ' provided to the amplified received signal. The second relative phase shift is generally the same phase shift applied to the signal during the transmit mode. If desired, the relative phase can be altered by feeding a different control signal to port 20c along control line 28a. At the second input-/output 20b of phase shifter 20, said signal is thus coupled to the second terminal of the transceiver circuit 22 and to the radar system 28 to be utilized and analyzed by the utilization system 28 in some known or predetermined manner.

Figures 2, 2A:
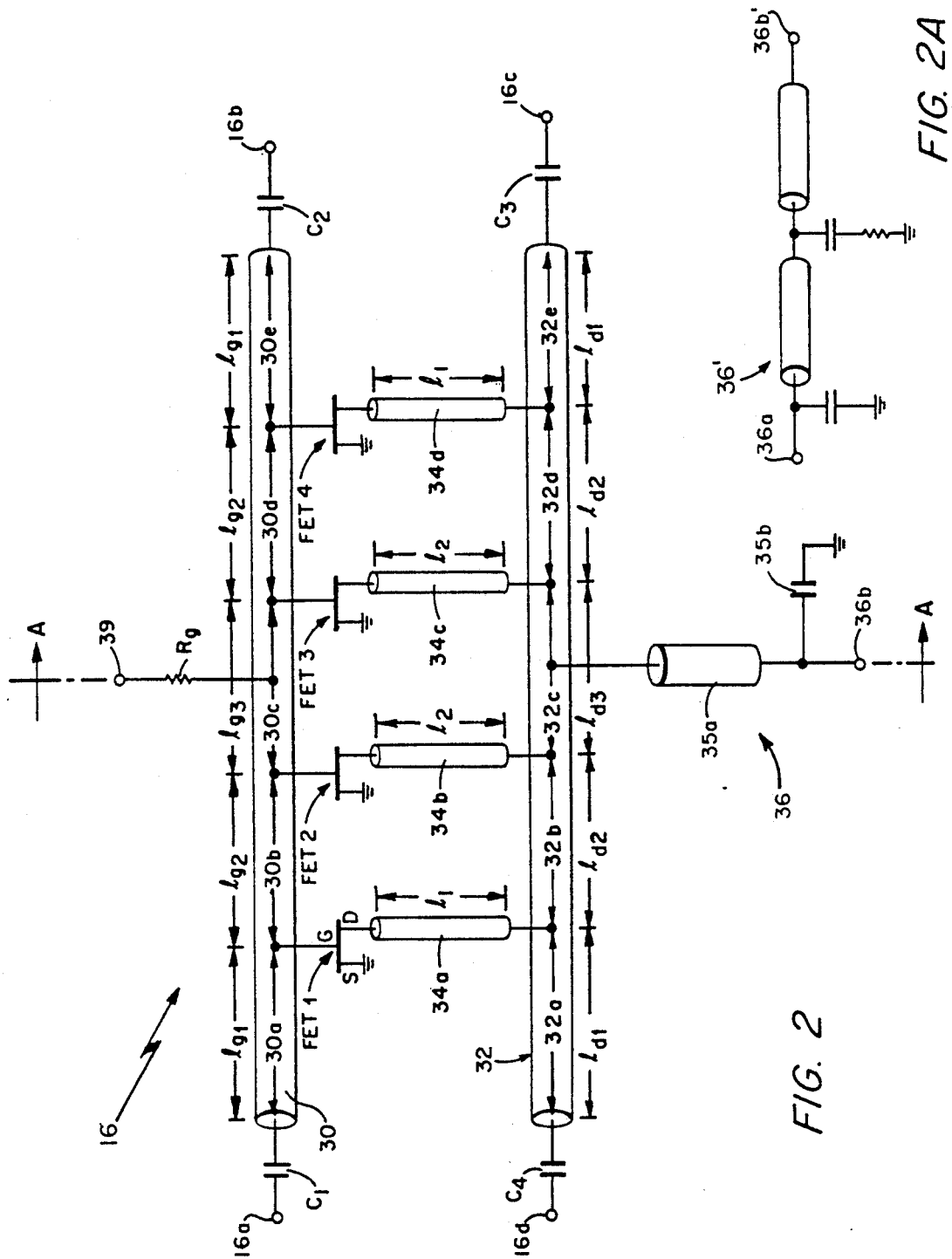
FIG. 2 is a schematic representation of a first embodiment of a bi-directional amplifier for use in the transceiver module of FIG. 1.
FIG. 2A is a schematic representation of an alternate drain bias network for the amplifier of FIG. 2.

Referring now to FIG. 2, a schematic representation of a symmetrical bi-directional amplifier 16 for use in the transceiver element 10 as described in conjunction with FIG. 1 is shown to include an input propagation network 30 having a first plurality of transmission line sections 30a-30e used to successively couple gate electrodes G of a plurality of field effect transistors FET 1 to FET 4 as shown. The symmetrical bi-directional amplifier 16 further includes an output propagation network 32 here comprised of a second, corresponding plurality of transmission line sections 32a-32e used to successively couple drain electrodes D of the field effect transistors FET 1 to FET 4. Preferably, the third transmission line sections 34a-34d are disposed between drain electrodes FET 1-FET 4 and the common output propagation network 32, as also shown. The input propagation network 30 is coupled via d.c. blocking capacitors $C_1$, $C_2$ to a pair of input terminals 16a and 16b of the amplifier. A d.c. gate bias voltage is here fed at the center point of transmission line 30 via a high impedance resistor $R_g$ or a high inductance value series inductor (not shown). Gate bias voltage is provided to a gate bias terminal 39 through resistor $R_g$ to properly bias the gates of the field effect transistors as is commonly known. Similarly, the output propagation network 32 is coupled via d.c. blocking capacitors $C_3$, $C_4$ to a pair of output terminals 16c and 16d of the circuit 16, as shown. Drain bias is here provided, via a network 36 which includes a quarter wavelength transmission line stub 35a which has an electrical pathlength corresponding to a quarter wavelength at the nominal or center frequency of the operating bandwidth of the amplifier, and a r.f. bypass capacitor 35b coupled between said stub 35 and ground, as shown. A drain bias d.c. voltage is fed to terminal 36b to properly bias the drains of each of the field effect transistors FET 1-FET 4, as shown.

An alternative to the bias arrangement described for the drain electrode is shown in FIG. 2A and includes a conventional ladder network having a resistor disposed in a capacitively coupled shunt path to ground. Here, such a ladder network would be preferred for broadband matching and thus operation of the distributed, symmetrical bi-directional amplifier and would be coupled prior to the connection of d.c. blocking capacitor $C_3$, for example, with the output propagation network 32. That is, terminal 36b' of the ladder network is coupled at the connection of the capacitor $C_3$ with the propagation network 32, as would be generally known. Preferably, in order to maintain symmetrical operation of the amplifier as will be described, two of such networks 36' (FIG. 2A) would be provided, one at either end of the output propagation network 32. Only one of such networks need be fed a D.C. bias voltage.

The bi-directional, distributed amplifier 16 shown in FIG. 2 is different than conventional distributed amplifiers, here each end of the propagation network serves as either an input terminal or an output terminal for the circuit. Such networks are not terminated in a characteristic impedance. A pair of substantially identical paths is provided between terminals 16a and 16c and terminal 16b and 16d. That is, in operation the amplifier provides substantially the same gain and phase characteristic to signals propagating between terminal 16a-16c as it does between terminals 16b and 16d. Such operation is provided by designing the amplifier to be symmetrical with respect to impedance, and electrical pathlength characteristics about a central portion of the amplifier, as denoted by the line AA. That is, proceeding from line AA, the length of the transmission line 30c is bifurcated such that a first half of said line has electrical pathlength of $l_{g3}/2$ and a second half of said line has identical pathlength of $l_{g3}/2$. The next pair of sections transmission lines 30b, 30d each have identical pathlength of $l_{g2}$ and the succeeding pair of sections of transmission line $l_{30a}$ and $l_{30e}$ have identical electrical pathlength of $l_{g1}$. Similarly, at the output propagation network, the network is symmetrical about line AA and proceeding from line AA, the transmission line section 32c has a pair of identical half electrical pathlengths $l_{d3}/2$, as shown. Sections 32b and 32d have identical electrical pathlengths of $l_{d2}$, whereas sections 32a and 32e also have identical electrical pathlengths of here $l_{d1}$. Drain electrodes D of each transistor FET 1-FET 4 are coupled to line 32 via transmission lines 34a-34d having lengths $l_1$, $l_2$, $l_2$, and $l_1$, respectively.

In practice lengths $l_{g1}$, $l_{g2}$, and $l_{g3}$ and $l_{d1}$, $l_{d2}$, and $l_{d3}$ may be different, and are selected to optimize signal propagation to one of said pair of output terminals and minimize gain ripple. Thus, a signal fed from terminal 16a through the field effect transistors FET 1-FET 4 will propagate along a path having an identical electrical pathlength as a signal fed from terminal 16b to terminal 16d. Moreover, the lengths $l_{g1}$-$l_{g3}$, $l_1$, $l_2$, and $l_{d1}$-$l_{d3}$ of transmission lines 30a-30e and 32a-32e are selected to provide equal electrical pathlengths between terminal 16a and terminal 16c through each of said field effect transistors FET 1-FET 4, as would commonly be done in a conventional distributed amplifier. Here, however, since the distributed amplifier 16 is also symmetrical about the line AA by use of the transmission line length as shown, equal electrical pathlengths are also provided between terminal 16b and 16d through each one of the paths provided by the field effect transistors FET 1-FET 4. This arrangement permits a signal to be fed to terminal 16a, propagate along lines 30a-30e, and have successive portions fed to gate electrodes G of transistors FET 1-FET 4. In response successive signal portions are coupled from drain electrode D thereof and propagates along line 32 and add up in phase at terminal 16c and provide a partial null signal at terminal 16d. Similarly, a signal coupled to terminal 16b has successive portions thereof fed through transistors FET 4-FET 1 to provide amplified portions at the drain electrode of said transistors, which add in phase at terminal 16d and provide a partial null signal at terminal 16c. Thus, a symmetrical bi-directional distributed amplifier is provided. Moreover, since the electrical pathlength between terminal 16a and 16c through field effect transistor FET 1 is identical to the electrical pathlength between terminal 16b and 16d through field effect transistor FET 4, as is the other corresponding sets of electrical pathlengths between said terminals, the amplifier will have substantially identical characteristics whether the signal is fed between terminal 16a and 16c or whether said signal is fed between terminal 16b and 16d.

A design example for the amplifier 16 as shown in FIG. 2 is described in conjunction with the accompanying table and description below:

Table of Electrical Pathlengths

| $l_{g1} = 0.396_{mm}$ | $l_{d1} = 0.902_{mm}$ | $l_1 = 0.117_{mm}$ |
|---|---|---|
| $l_{g2} = 0.858_{mm}$ | $l_{d2} = 1.468_{mm}$ | $l_2 = 0.240_{mm}$ |
| $l_{g3} = 0.986_{mm}$ | $l_{d3} = 1.296_{mm}$ | |

The circuit is designed to be fabricated on a substrate of gallium arsenide having a thickness of 0.1 mm. The transmission line sections may be fabricated as lengths of microstrip transmission line or to conserve space are alternatively fabricated as spiral inductors. Moreover, lumped element lines or artificial lines may alternatively be used. The line lengths shown in the table are for field effect transistors FET 1-FET 4 each having 200 mm of total gate periphery. The input transmission line inductor width is 0.01 mm whereas the output transmission line conductor width is 0.02mm.

Figure 3:
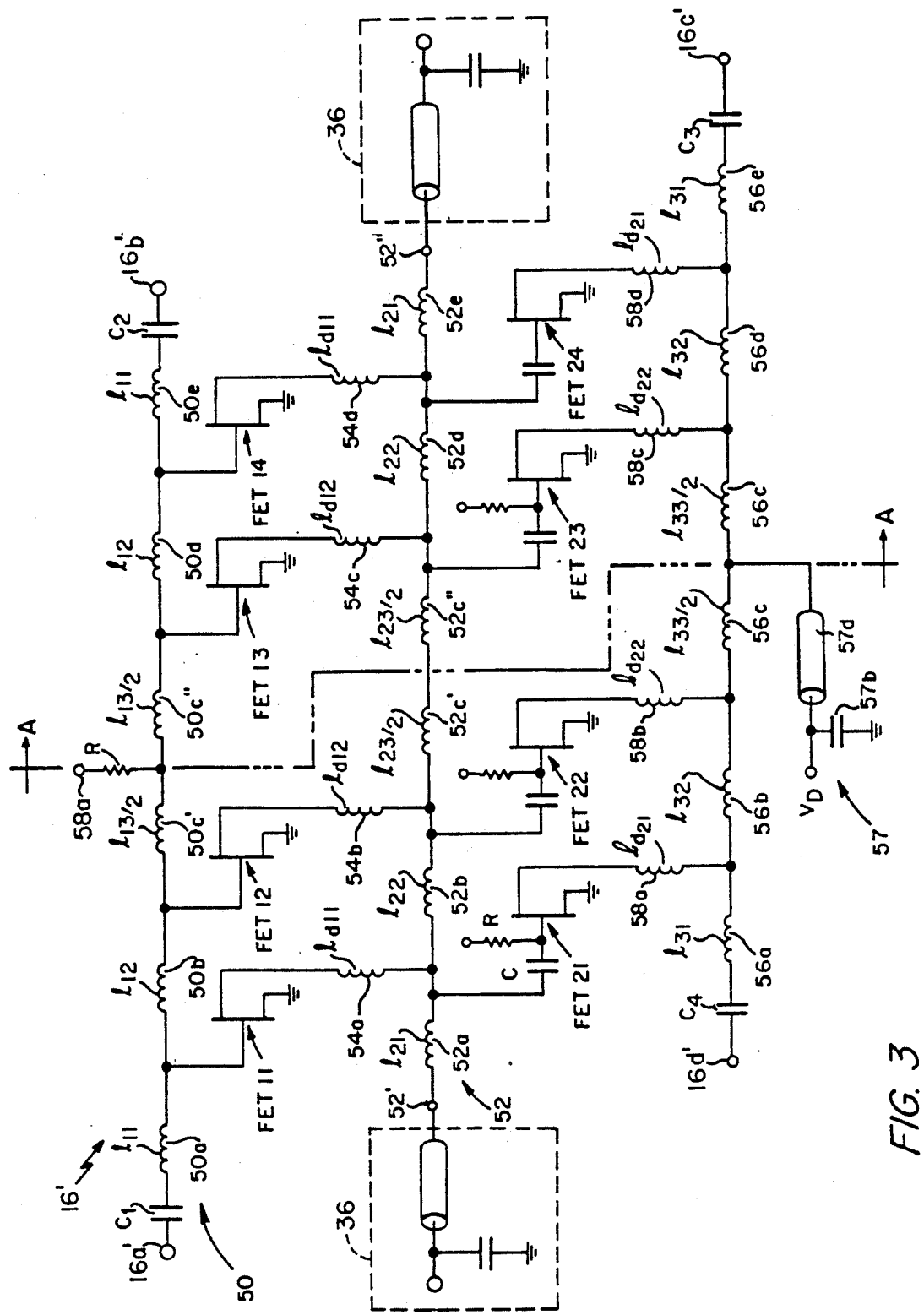
FIG. 3 is a schematic representation of an alternate embodiment of a bi-directional amplifier for use in the transceiver module of FIG. 1.

Referring now to FIG. 3, an alternate embodiment 16' of a symmetrical bi-directional amplifier, here a matrixed, symmetrical bi-directional amplifier is shown to include a pair of input terminals 16a', 16b', a pair of output terminals 16d'', 16c', a first plurality of field effect transistors FET 11-FET 14, and a second plurality of field effect transistors FET 21-FET 24. Here, the pair of input terminals 16a', 16b' are coupled by an input propagation network 50 comprised of here inductors preferably spiral inductors 50a-50e. Here, spiral inductors 50a-50e provide electrical pathlengths of $l_{g11}$, $l_{g12}$, $l_{g13}$, $l_{g12}$, and $l_{g11}$, respectively, as shown. Said propagation network 50 is shown to successively couple the gate electrodes G of the field effect transistors FET 11-FET 14 to provide the respective electrical pathlengths between said gate electrodes as shown.

The output or drain electrodes of the field effect transistors FET 11-FET 14 are coupled via inductors 54a-54d, respectively, to a second or intermediate propagation network 52 comprised of inductors preferably spiral inductors 52a-52e, as also shown. The spiral inductors 52a-52e provide electrical pathlengths of $l_{21}$, $l_{22}$, $l_{23}$, $l_{22}$, $l_{21}$, respectively. Here said transmission line network 52 provides an output coupling network to successively couple the output electrodes of the transistors FET 11-FET 14, as well as, provide an input coupling network to successively couple the input or gate electrodes of the second plurality of field effect transistors FET 21-FET 24. The output electrodes of the second plurality of field effect transistors are coupled via inductors 58a-58d having electrical lengths of $l_{d21}$, $l_{d22}$, $l_{d22}$, $l_{d21}$, respectively, and an output transmission network 56 comprised of sections 56a-56e, as shown. Here each of said transmission line sections have electrical pathlengths of $l_{31}$, $l_{32}$, $l_{33}$, $l_{32}$, $l_{31}$, respectively. Thus, the electrical pathlength of each one of the transmission line sections is selected to provide a network which is symmetrical about the line AA as also shown and described above in conjunction with FIG. 2.

Here, however, a low noise high power symmetrical bi-directional amplifier having low gain ripple is provided, which is particularly desirable when the amplifer 16' is used in transceiver applications. The matrix amplifier 16' is equivalent to a pair of cascaded bi-directional amplifiers. In transceiver applications, such as described in conjunction with FIG. 1, it is most desirable to have a low noise amplifier as the first amplifier in the receive channel or path. With the bi-directional matrix amplifier 16', the first stage or first plurality of transistors FET 11-FET 14 are fabricated and selectively designed to provide a relatively low power, low noise amplifier stage. During a receive mode of operation, the first stage of amplification in the receive channel or path is a low noise amplification stage. The second stage of the matrix bi-directional amplifier 16' shown in FIG. 3 is designed to provide high power. This is also desirable in receive mode since it reduces further amplification requirements in the radar system. During transmit mode this is also desirable for use in the transceiver module 10 (FIG. 1) to provide a higher power transmit signal to the radiating element 11.

Additional stages of matrixed/distributed amplification may be provided to the circuit shown in FIG. 3 to provide higher output power and gain. Accordingly, a three stage matrix distributed amplifier may be provided using the similar arrangement as described for that in FIG. 3.

Here, electrical signal paths between the input terminal 16a', for example, and output terminal 16c' include the same path as that described in conjunction with FIG. 2, as well as, additional paths created by the matrix or cascade matrix of the pair of amplifying stages. For example, an input signal fed to input terminal 16a' has successive portions which are coupled to each one of the gate electrodes of the field effect transistors FET 11-FET 14. The transistors FET 11-FET 14 are responsive to said signal portions and provide in response a corresponding plurality of output signal at the drain electrodes D thereof. The output signal portions propagate along the intermediate propagation network 52. A pair of portions of each of said output signal portions propagates along the propagation network 52 towards each end. In the direction towards the end portions 52'' of the network 52, such signals add in phase to provide a travelling wave as is commonly known in distributed amplifiers. At the opposite end, 52' of the propagation network 52, the waves somewhat distructively interfere. Here, however, in addition to the output signals propagating along the propagation network 52 and adding in succession to provide a signal at the end 52'', said portions of said signals are also successively coupled to the second plurality of field effect transistors FET 21-FET 24 to provide corresponding output signals at the drain electrodes thereof which likewise, successfully propagate along the output network 56. Thus, an input signal fed to terminal 16a' provides an output signal at terminal 16c' which is amplified by both the additive gain associated with the coupling of successive portions of said signals through the stages of distributed amplifier, as well as, the multiplicative gain associated with coupling said signal through respective cascaded transistors.

Bias networks are provided to the amplifier 16' as shown. Gate bias is provided to FET 11-FET 14, via the input propagation network 50 by a high value resistor R coupled at here preferably the center of the network 50. Gate bias V is fed to such resistor R at terminal 58a. Drain bias for FET 11-FET 14 is here provided at the terminals 52' and 52" of propagation network 52 by bias networks 36 as described in conjunction with FIG. 2 or the broadband ladder network 36' as described in conjunction with FIG. 2A. These networks provide drain bias to the drain electrodes D of the field effect transistors FET 21-FET 24. A separate gate bias needs to also be provided to the second set of field effect transistors FET 21-FET 24. Here said gate bias ($V_g$) is provided by D.C. blocking capacitors C disposed to couple the gate electrodes to the propagation network 52 and separate pull up resistors R as also shown. Here the value of said capacitors C is relatively large to provide an essentially AC short circuit path between the gate electrode and the transmission network 52. A third drain bias network 57 is also provided to bias the output network 56. Here said third drain bias network 57 includes a quarter wavelength stub 57a and shunt mounted capacitor 57b, as described for network 36 (FIG. 2) coupled at the center of the propagation network 56. Alternatively, bias circuits may be provided at each end of the network 50, as well as, each end of the network 56 to maintain a symmetric impedance characteristic about line AA of the distributed amplifier.

Figure 4A:
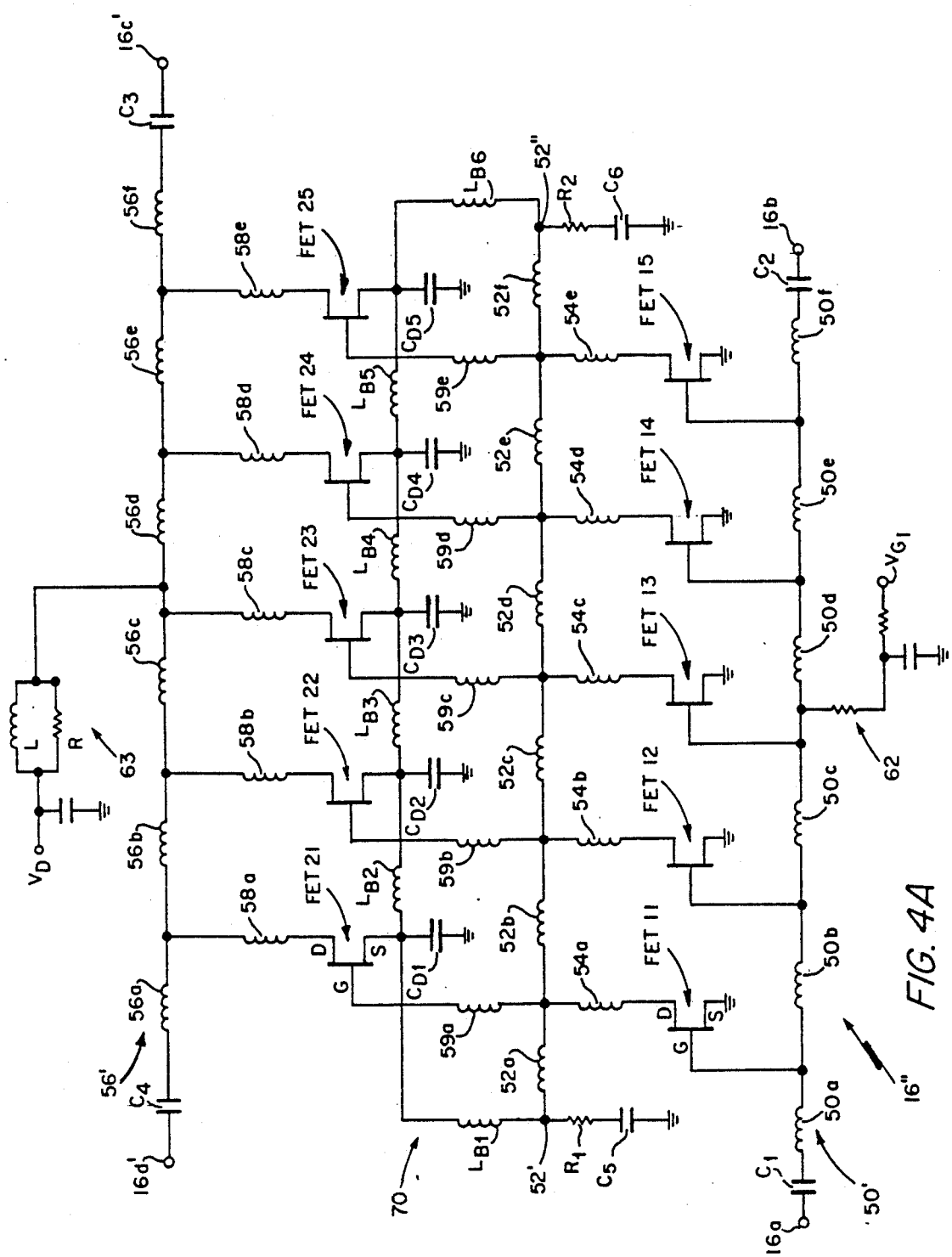
FIGS. 4A and 4B are schematic of matrixed bi-directional amplifiers having alternate bias networks.
Figure 4B:
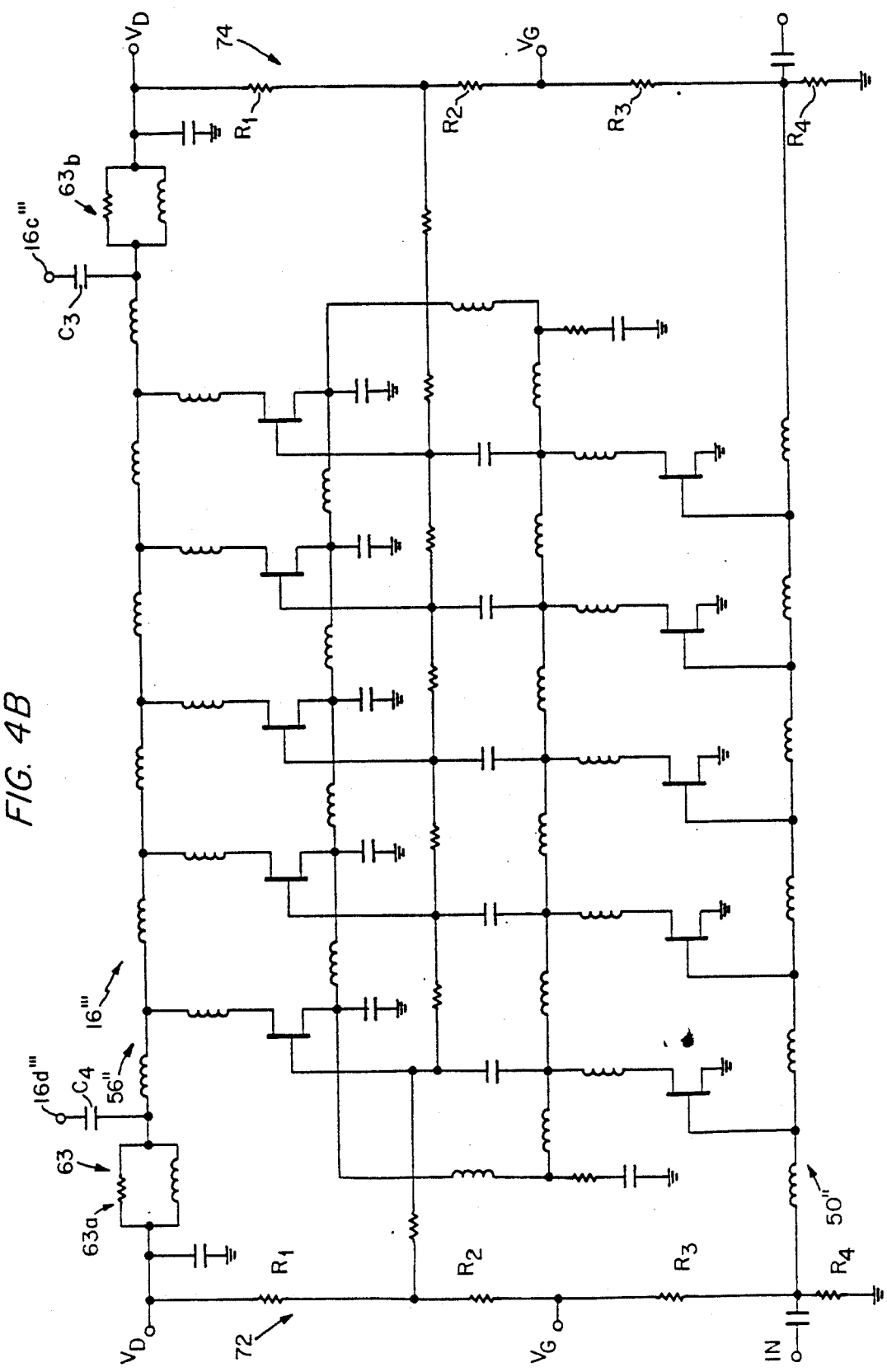

Referring now to FIGS. 4A and 4B, alternative biasing networks for the matrix bi-directional distributed amplifier 16' of FIG. 3 are shown.

Referring now to FIG. 4A, a matrixed distributed, bi-directional amplifier 16" having an alternate biasing arrangement is shown to include here two sets of field effect transistors FET 11-FET 15 and FET 21-FET 25, have each set having five transistors connected in a matrix cascade as generally described in conjunction with FIG. 3, except for the presence of an extra transistor in each set of said transistors. The amplifier 16" includes an input network 50' here substantially similar to input network 50 of FIG. 3 except that said network has an extra element 50f to interconnect FET 15 and thus the sections have electrical pathlengths of $l_{g11}$, $l_{g12}$, $l_{g13}$, $l_{g13}$, $l_{g12}$, and $l_{g11}$, respectively as shown. An intermediate propagation network 52' is also included in said amplifier 16" and is used to successively and matrixly couple the output or drain electrodes D of the transistors FET 11-FET 15 to the input or gate electrodes G of a second set of transistors FET 21-FET 25. Here, network 52') is substantially similar to network 52 of FIG. 3 except for the addition of an extra element 52f and such sections have electrical pathlengths of $l_{21}$, $l_{22}$, $l_{23}$, $l_{23}$, $l_{22}$, and $l_{21}$, respectively. The drain electrodes of transistors FET 11-FET 14 are coupled to the intermediate propagation network 52' via lines 52a-52e, having lengths of $l_{d11}$, $l_{d12}$, $l_{d13}$, $l_{d12}$, $l_{d11}$, respectively. Output propagation network 56' is used to successively couple the output or drain electrodes of the field effect transistors FET 21-FET 25 between a pair of output terminals 16d", 16c", as also shown. Such network is similar to network 56 (FIG. 3), except for the additional section 56f and thus such sections have lengths of $l_{31}$, $l_{32}$, $l_{33}$, $l_{33}$, $l_{32}$, $l_{31}$, respectively. The drain electrodes of transistors FET 21-FET 24 are coupled to the output propagation network 56 via transmission line sections 58a-58e having lengths $l_{d21}$, $l_{d22}$, $l_{d23}$, $l_{d22}$, $l_{d21}$, respectively. Here the gate electrodes of the second set of transistors FET 21-FET 25 are coupled to the intermediate propagation network 52 via transmission line sections 59a-59e, as shown. These optional transmission line sections 59a-59e may be desirable in certain layouts of the matrix distributed amplifier particularly when fabricated as a monolithic microwave integrated circuit. These sections have lengths of $l_{g21}$, $l_{g22}$, $l_{g23}$, $l_{g22}$, $l_{g21}$, respectively.

The amplifier 16" is provided gate bias to transistors FET 11-FET 15 via a network 62 which is coupled to the center of the input propagation network 50' and includes a shunt bypass capacitor and a voltage divider network comprised of a pair of resistors (not numbered). Similarly, the drain bias is provided to the output network 56' and thus to the drain electrodes of the second set of transistors FET 21-FET 25 by a network 63 which here includes an inductor disposed in shunt across resistor R coupled to a shunt mounted r.f. bypass capacitor C which is connected to the center of the propagation network 56'. Alternatively, the network 36 (FIG. 2) may be used. Gate bias is provided to the second set of field effect transistors FET 21-FET 25 as is drain bias provided to the first set of transistors FET 11-FET 15 via a network 70 comprised of inductors $L_{B1}$-$L_{B6}$, and D.C. blocking capacitors $C_{d1}$-$C_{d5}$ disposed between the source electrodes of transistors FET 21-FET 25 and ground as shown. The gate bias/drain bias network further includes a pair of capacitively isolated resistor shunt paths comprised of resistors $R_1$, $R_2$ and capacitors $C_5$, $C_6$ mounted in respective series networks (not numbered) between the ends 52' 52" of intermediate transmission line 52' and ground. A D.C. current path is provided through transistors FET 21—FET 25 via inductors $l_{B1}$-$l_{B6}$, whereas to a.c. or microwave frequency signals, these inductors provide a high impedance and thus isolation between the transistors FET 21-FET 25 and FET 11-FET 15. The capacitors $C_{d1}$-$C_{d5}$ provide, at radio frequency signals, an r.f. ground for each of the transistors FET 21-FET 25, thus permitting the gates of the second set of transistors and the drains of each of the first set of transistors to be D.C. biased. One drawback with this bias arrangement, however, is that the transistors FET 21-FET 25 are required to run at a bias determined by $I_{DSS}$. Thus, amplifier performance will be sensitive to the gate voltage applied to the first set of transistors, since both sets of transistors must operate at the same drain current. Thus minor variations in processing between transistors may cause problems in biasing.

Referring now to FIG. 4B, an alternate embodiment of a biasing network to overcome the bias sensitivity described above is shown. Here amplifier 16'" includes substantially the same components as described above for amplifier 16", and thus such like components are not numbered in FIG. 4B except for those specifically mentioned herein. The bias network for the amplifier 16'" includes a pair of resistor divider networks 72, 74 here each being comprised of four resistors R1-R4. Also, coupled to the end of the output propagation network 56" are here a pair of drain bias networks 63a and 63b of the type generally described in conjunction with FIG. 3A for network 63. Here said networks are coupled between the ends of propagation network 56" and the connection with the external D.C. blocking capacitor $C_3$, $C_4$. Each of the voltage divider networks 72, 74 are coupled between its respective drain bias network 63a, 63b or 36 (FIG. 2) and the input propagation network 50" as shown. Although only one of said voltage divider networks 72, 74 are needed to provide bias to the respective transistors, a pair of such voltage divider networks 72, 74 are preferred here to insure that impedance of the amplifier will be symmetric about the line AA. Each of the voltage dividers are disposed across both of the sets of field effect transistors FET 11–FET 15 and FET 1–FET 25, as shown, to insure that both sets of field effect transistors operate at the same gate to source voltage. The amplifier, therefore, can operate over a much wider range of gate bias voltages. Further, details on the operation of the biasing schemes for the amplifier shown in FIGS. 4A and 4B are described in a copending application entitled "Biasing Network for Matrix Amplifiers," Ser. No. 443,985, filed on Nov. 30, 1989 by Chu et al. and assigned to the assignee of the present invention, said application being incorporated herein by reference.

Figure 5:
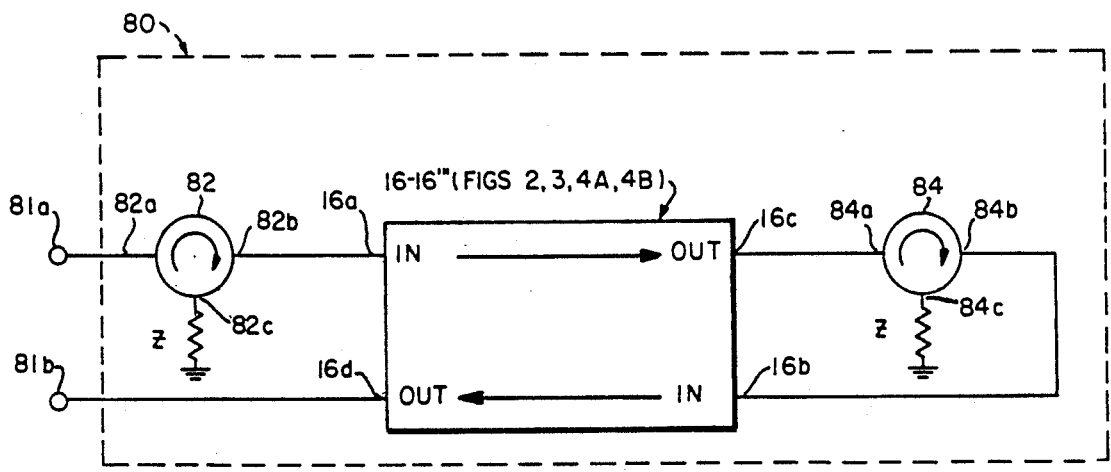
FIG. 5 is a block diagram of a recirculating amplifier using the bi-directional amplifier of FIG. 2 or FIG. 3.
Figure 6:
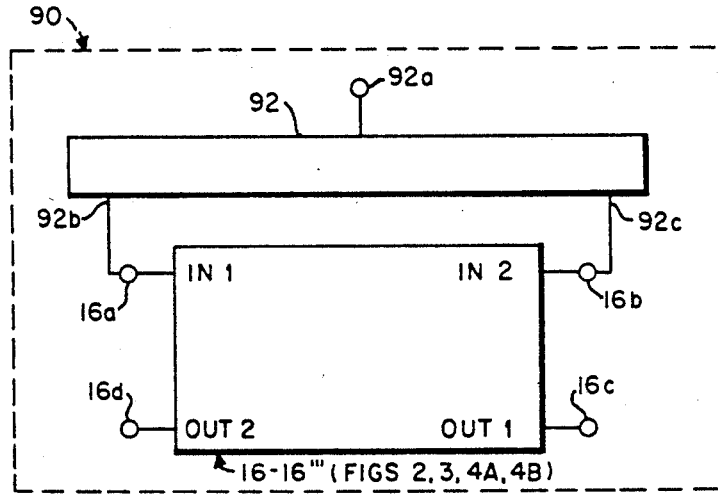
FIG. 6 is a block diagram of an amplifying power divider using the bi-directional amplifier of FIG. 2 or FIG. 3.
Figure 7:
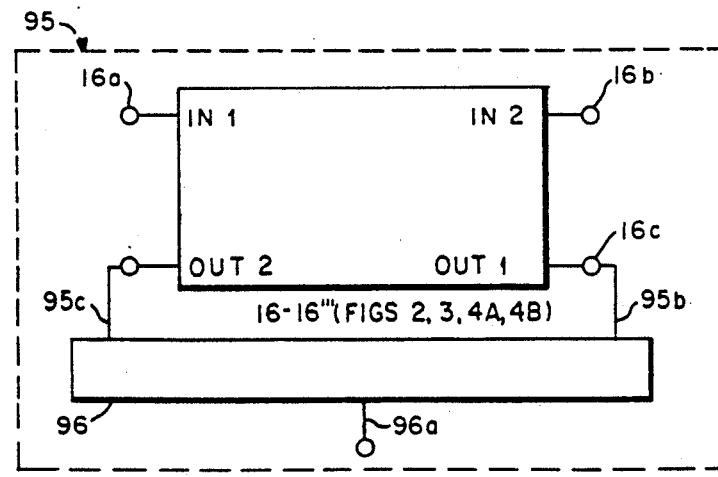
FIG. 7 is a block diagram of an amplifying power combiner using the bi-directional amplifier of FIG. 2 or FIG. 3.

Referring now to FIGS. 5–7, alternate applications for the bi-directional amplifier 16–16''' (FIGS. 2, 3, 4A, 4B) are shown. Referring first to FIG. 5, a recirculating amplifier 80 is shown to include here a pair of circulators 82, 84 each of which has three ports 82a–82c, 84a–84c, respectively with ports 82c and 84c herein being terminated in characteristic impedance Z. The circulators 82 and 84 are coupled to one of the bi-directional amplifier 16–16''' as described in conjunction with FIGS. 2, 3, 4A, and 4B. Thus, any one of the embodiments of the bi-directional amplifier may be used. Using amplifier 16 as an example, one of the input terminals 16a of the bi-directional amplifier 16 is coupled to one of the ports here 82b of circulator 82. The corresponding output terminal of said amplifier 16 that is the first output terminal 16c is coupled to one of the ports 84a of circulator 84. A second one of said ports of circulator 84 here port 84b is coupled to the second input terminal 16b. The second output terminal 16d of the amplifier 16 provides the output terminal 81b of the recirculating amplifier 80. Thus, a signal fed at input terminal 81a of the amplifier 80 is coupled between port 82a and 82b of circulator 82, fed to the input of the first amplifier path of bi-directional amplifier 16, coupled through the second circulator 84 via ports 84a and 84b and is recirculated back to amplifier 16 through the second amplifier path of amplifier 16 between terminal 16b and 16d. Thus, two stages of amplification are provided to the input signal fed at terminal 81a while using only one amplifier circuit.

Referring now to FIG. 6, an amplifying power divider 90 is shown to include a power divider circuit 92 here such as, for example, a Wilkinson power divider or other similar circuits having an input port 92a which provides at a pair of output ports 92b, 92c thereof, a pair of equal amplitude in phase signals. Said signals are fed to the input terminals 16a, 16b of one of the aforementioned bi-directional amplifiers 16–16''' (FIGS. 2, 3, 4A, and 4B). At the output terminals of said amplifier 16, for example, are accordingly provided pair of equal amplitude, in phase output signals which have been amplified and thus provided gain and power in accordance with the characteristics of the amplifier 16.

Referring now to FIG. 7, an amplifying power combiner 95 is shown to include one of the amplifiers 16–16''' (FIGS. 2, 3, 4A, and 4B) here amplifier 16 having a pair of input terminal 16a, 16b which are fed a pair of input signals and a pair of output terminals 16c, 16d which are coupled to a pair of common ports 96b, 96c of a power combiner/divider of the Wilkinson type or other varieties as described in conjunction with FIG. 6. The common terminal 96a of the power combiner 96 provides the output terminal for the amplifying power combiner. of amplifier 16, propagate through the pair of amplifying chains in said amplifier and appear at the output terminals 16c, 16d of said amplifier. The output signals are then coupled and combined together to provide a composite output signal at terminal 96a.

Figure 8:
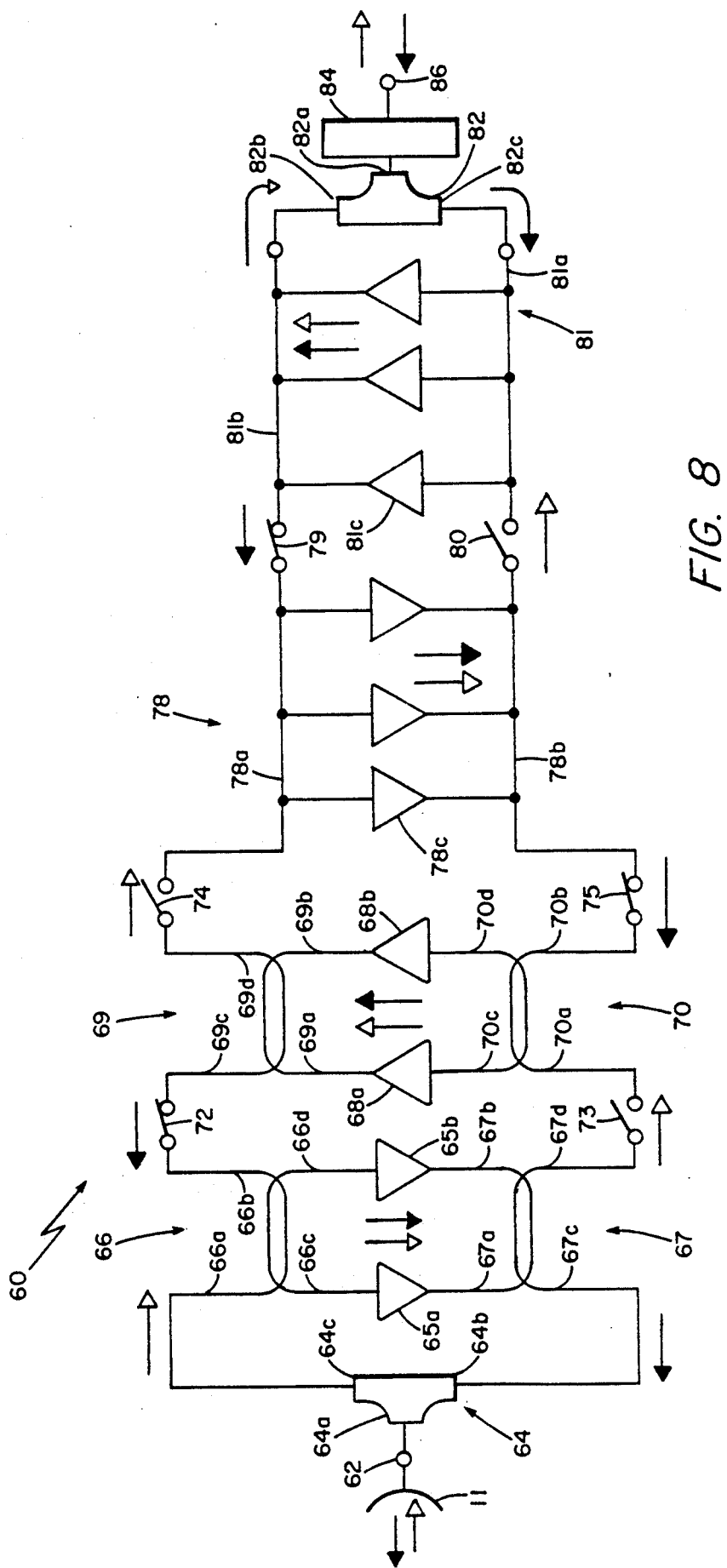
FIG. 8 block diagram of an alternate embodiment of a transceiver, particularly for use in high power applications.

Referring now to FIG. 8, an alternate embodiment of a transceiver 60 is shown as having a first input/output terminal 62 and a second input/output terminal 86, as shown, The first terminal 62 is coupled to a radiating element 11. The transceiver further includes a first RF switch 64, here a terminating RF switch, as described in conjunction with FIG. 1, having a common port 64a and a pair of branch port 64b, 64c, as also described in conjunction with FIG. 1 for switch 14. The transceiver further includes a pair of quadrature couplers 66, 67 used to couple a pair of amplifiers stages 65a, 65b to provide a balanced amplifier path. Couplers 66 includes a pair of input terminals 66a, 66b, with terminal 66a coupled to terminal 64c of switch 64, and terminal 66b coupled to a first single-pole/single-throw switch 72. Outputs 66c, 66d of coupler 66 are coupled to respective amplifier stages 65a, 65b, here said amplifiers being any conventional amplifier and preferrably being linear high power amplifier stages. The outputs of said amplifier stages 65a, 65b are coupled to the ports 67a, 67b of coupler 67. A first output port 67c of coupler 67 is coupled to the branch port 64b of switch 64 and a second one of the output port 67d of coupler 67 as coupled to a second single-pole/single-throw switch 73, here also a terminating switch. Switches 72, 73 provides a first set of repricating switches to steer signals through cascaded paths. The second terminals of switches 72 and 73 are coupled respectively to the input and output ports of a second pair of quadrature couplers 70 and 69 as shown. Here the interconnections of said couplers 70 and 69 and amplifier stages 68a and 68b are substantially similar as described above for couplers 66, 67 and amplifier stages 65a, 65b.

Here said couplers 69 and 70 provide a pair of output terminals and input terminals respectively for the coupled amplifier chain. Thus, the first output terminal 69c of coupler 69 is coupled to the second end of switch 72, the second output terminal 69d of coupler 69 is coupled to one end of a third single-pole/single-throw switch 74, whereas the input terminal 70a of coupler 70 is connected to switch 73. The second input terminal 70b of coupler 70 is connected to switch 75, as also shown. Switch 74 and switch 75 are a second set of repricating switches and are coupled respectively to an input propagation network 78a and an output propagation network 78b of a bi-directional distributed amplifier 78, having successively coupled field effect transistors, and as described in conjunction with FIG. 2. A third pair of single-pole/single-throw switches 79, 80 are used to cascade interconnect the amplifier stage 78 with a second amplifier stage 81, here also having an input propagation network 81a and output propagation network 81b successively interconnecting a plurality of transistors 81c, and being of the type as generally described in conjunction with FIG. 2.

The other ends of said propagation networks 81a, 81b are coupled to branch ports of the second single-pole/-doublethrow terminating switch 82. Common port 82a thereof is coupled to a phase shifter 84, as also described in conjunction with FIG. 1. The other port of the phase shifter 84 is coupled to the second terminal 86 of the transceiver 60.

In operation, a signal is fed between terminal 86 to the radiating element 11 in a transmit mode, for example, or from radiating element 11 to terminal 86 in a receive mode. Using the transmit mode as representative of the operation of the circuit with solid arrows denoting the signal path during transmit, a signal is fed through the phase shifter 84 and is provided with a selected differential phase shift. The phase shifted signal is then fed from the phase shifter 84 to the common port 82a of switch 82. In response to a control signal fed to a control port 82d the common port 82a is coupled to the branch port 82c. The signal is thus fed to the input propagation network 81a of amplifier 81. The signal is successively fed through the transistors 81c to the output propagation network 81b and is fed to the output terminal thereof, which is here coupled to single-pole/single-throw switch 79. Thus, in this mode of of operation, single-pole switch 79 is in a closed position where single-pole/single-throw switch 80 is in an open position, as shown. The signal is fed through switch 79 to input propagation network 78a of amplifier 78 and is again successfully coupled through the plurality of transistor elements 78c to the output propagation network 78b. Such signal is fed from output propagation network 78b to the single-pole/single-throw switch 75, which is in a closed position with single-pole/single-throw switch 74 being in an open position. The signal is then fed to terminal 70b of coupler 70. At terminals 70c, 70d of coupler 70, a pair signal portions, equal in magnitude and in quadrature are provided, and coupled to the amplifiers 68a, 68b. The signal component at amplifier 68a here is being shifted by a 90° phase shift relative to the phase of signal component at amplifier 68b. Said signal component propagate through the amplifiers 68a, 68b are amplified and emerge at the outputs of the amplifiers 69a, 69b. The amplified signal portions are fed to the second coupler 69. Here coupler 69 is arranged with respective coupler 70, such that said amplified, quadrature signals add in-phase at terminal 69c and cancel at terminal 69d. Thus at terminals 69c, the amplified high-powered signal is coupled to the single-pole/singlethrow switch 72, which is closed, and is fed to couplers 66, 67, and amplifiers 65a, 65b. The signal propagates through quadrature couplers 66, 67 and amplifier stages 65a, 65b, in a similar manner is for couplers 69, 70, here emerging at terminal 67c of coupler 67 and is fed to the branch port 64b of switch 64. Similarly, in response to a control signal fed to a port 64d, switch 64 couples its common port 64a to the branch port 64b thus providing a path between the coupler 67c and the radiating element 11. Each of the single-pole/single throw switches pairs 72, 73; 74, 75; and 79, 80 are controlled by control signals (not shown) as would be apparent to one of skill in the art.

The pair of quadrature couplers and the pair of amplifier chains for each of the high power stages 65a, 65b are interconnected to steer a signal through a balanced symmetric, high power amplifier stage.

Thus, using couplers 66, 67 and amplifiers 65a, 65b as an example, for a receive mode, a signal is fed to terminal 66a of coupler 66, with terminal 66c being the in-phase terminal and terminal 66d being the quadrature terminal. Thus at terminal 66d, a signal having −90° relative phase shift is provided, whereas at terminal 66c, such signal has a relative phase shift of 0°. These signals propagate through the pair of identical amplifiers, 65a, 65b and emerge therefrom with the −90° relative phase difference. The signal from amplifier 65a is fed to terminal 67a, said terminal being the in-phase terminal, whereas the signal from amplifier 65b is fed to the quadrature terminal 67b. At the outputs of coupler 67 therefor, a pair of composite signals are provided. A first one of component signals from amplifier 65a has a first component, which is fed to terminal 67a with a relative phase shift of −90° at terminal 67d and 0° at terminal 67c. The components from amplifier 65b are likewise fed to terminal 67b, and provide a relative phase shift of −90° at terminal 67d and a relative phase of −180° at terminal 67c. Thus, at terminal 67c such signals add substantially out of phase and thus cancel each other, whereas at terminal 67d, such signals add in-phase and to propagate through switch 73 in the receive mode of operation. A similar arrangement is provided with coupler 69 and 70 and amplifier stages 68a, 68b. Moreover, during transmit mode, such an arrangement also holds. The embodiment shown in FIG. 8 is particularly desirable for applications where noise characteristics are relatively unimportant in comparison to providing high power, such as in electronic countermeasures applications. For applications where noise considerations are important, the circuit as shown in FIG. 1, using the bi-directional amplifiers of FIG. 2 or 3 is generally preferrable.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. A circuit for coupling electromagnetic energy between a pair of terminals comprises:
   means for steering electromagnetic energy between said terminals through one of a pair of signal paths selected in accordance with a control signal fed to said means, said means further comprising:
   a bi-directional amplifier, having a pair of input signal ports, and a pair of output signal ports, disposed in said pair of signal paths of said steering means.

2. The circuit of claim 1 wherein said bi-directional amplifier includes a pair of signal paths, having common paths with a first signal path being disposed between a first one of the pair of input ports and a first one of the pair of output ports and the signal path being disposed between a second one of the pair of input ports and a second one of the pair of output ports.

3. The circuit of claim 1 wherein said bi-directional amplifier is a distributed amplifier comprising:
   an input propagation network coupled between the pair of input signal ports of the amplifier;
   a plurality of transistors having input electrodes successively coupled by the input propagation network; and
   an output propagation network coupled between the output signal ports of the amplifier successively coupling the output electrodes of the plurality of transistors.

4. The circuit of claim 3 wherein said bi-directional distributed amplifier has input and output propagation networks selected to provide equal electrical pathlengths between the first input port and the first output port which are equal to the corresponding electrical pathslengths between the second input and the second output port.

5. The circuit of claim 4 wherein each of said plurality of transistors have corresponding intrinsic input and output reactances, and wherein said input and output propagation networks have characteristic impedances in accordance with said respective reactances to provide bi-directional amplifier with predetermined input and output impedances at each of said input ports and output ports.

6. A transceiver for coupling a pair of signals between a pair of ports comprising:
   first means coupled to said pair of ports of the transceiver for providing a pair of switchable signal paths;
   a bi-directional amplifier having a pair of input signal ports and a pair of output signal ports coupled in said pair of signal paths of said first providing means; and
   second means coupled between said first providing means and a second one of the pair of ports of transceiver for providing a phase shift to a signal propagating therethrough.

7. A transceiver for steering a pair of signals between a pair of terminals comprises:
   a first steering means having a common port and a pair of branch ports;
   a second steering means having a common port and a pair of branch ports;
   a bi-directional amplifier having a pair of input ports and a pair of output ports, with a first one of said input ports of the amplifier being coupled to one of the branch ports of the first steering means and a corresponding one of the output ports of said amplifier being coupled to one of the branch ports of said second steering means, and with the second output port of said amplifier being coupled to the second branch porrt of the first steering means and the second input port of the amplifier being coupled to the second branch port of the second steering means; and
   a phase shifter coupled between one terminal of the transceiver and a common port of one of said pair of steering means with the other steering means being coupled to the second terminal of the transceiver.

8. The transceiver of claim 7 wherein said first and second steering means are RF switches responsive to a control signal to switch signal paths between their respective common ports and a selected one of their pair of branch ports.

9. The transceiver of claim 8 wherein said amplifier has a pair of signal paths having common ports, with a first one of the signal paths disposed between first one of said input and output ports of the amplifier, and with a second one of the signal paths disposed between second one of said input and output ports of the amplifier.

10. The circuit of claim 9 wherein said bi-directional amplifier is a distributed amplifier comprising:
    an input propagation network coupled between the pair of port signals ports of the amplifier;
    a plurality of transistors having input electrodes successively coupled by the input propagation network; and
    an output propagation network coupled between the output signal ports of the amplifier successively coupling the output electrodes of the plurality of transistors.

11. The circuit of claim 10 wherein said bi-directional distributed amplifier has input and output propagation networks selected to provide equal electrical pathlengths between the first input port and the second input port which are equal to the electrical pathlengths between the second input and the second output port.

12. The circuit of claim 11 wherein each of said plurality of transistors have corresponding intrinsic input and output reactances, and wherein said input and output propagation networks have characteristic impedances in accordance with said respective reactances to provide the bi-directional amplifier with predetermined input and output impedances at each of said input ports and output ports.

* * * * *